(12) United States Patent
Ju

(10) Patent No.: US 6,478,975 B1
(45) Date of Patent: Nov. 12, 2002

(54) INDUCTOR AND FABRICATING METHOD THEREOF

(75) Inventor: Jae-il Ju, Cheongju-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 176 days.

(21) Appl. No.: 09/644,230

(22) Filed: Aug. 23, 2000

(30) Foreign Application Priority Data

Aug. 23, 1999 (KR) .............................................. 99-34966

(51) Int. Cl.[7] .............................................. H01L 27/00
(52) U.S. Cl. .............................. 216/6; 216/11; 216/18; 216/39; 216/80; 438/723; 438/756
(58) Field of Search ................................ 216/6, 11, 18, 216/39, 80; 438/439, 723, 756

(56) References Cited

U.S. PATENT DOCUMENTS

| | | | |
|---|---|---|---|
| 3,988,764 A | 10/1976 | Cline et al. | |
| 5,370,766 A | 12/1994 | Desaigoudar et al. | |
| 5,709,805 A | * | 1/1998 | Davis et al. .................. 216/18 |
| 6,207,234 B1 | * | 3/2001 | Jiang ............................ 216/17 |
| 6,326,314 B1 | * | 12/2001 | Merrill et al. .................. 216/2 |

FOREIGN PATENT DOCUMENTS

| | | | | | |
|---|---|---|---|---|---|
| JP | 406005785 A | * | 1/1994 | ........... | H01L/27/04 |
| JP | 407074311 A | * | 3/1995 | ........... | H01L/27/04 |
| JP | 411111926 A | * | 4/1999 | ........... | H01L/27/04 |

* cited by examiner

Primary Examiner—Frankie L. Stinson
Assistant Examiner—Jiri Smetana
(74) Attorney, Agent, or Firm—Birch, Stewart, Kolasch & Birch, LLP

(57) ABSTRACT

In the method of fabricating an inductor, at least first and second conductive segments are formed in a semiconductor layer spaced apart in a first direction. A first dielectric layer is formed over a portion of the semiconductor layer along the first direction such that the first dielectric layer crosses the first and second conductive segments. A conductive core is formed on the first dielectric layer, and a second dielectric layer is formed over the semiconductor layer. First and second contact holes are formed in the second dielectric layer such that the first contact hole exposes a portion of the first conductive segment on a first side of the first dielectric layer and the second contact hole exposes a portion of the second conductive segment on a second side of the first dielectric layer. Then, a conductive pattern segment is formed over the second dielectric layer such that the conductive pattern segment electrically connects the first and second conductive segments via the first and second contact holes.

15 Claims, 5 Drawing Sheets

INDUCTOR AND FABRICATING METHOD THEREOF

BACKGROUND OF THE INVENTION

1. Field of Invention

The present invention relates to an inductor and fabricating method thereof, more particularly, to an inductor formed on a semiconductor substrate where other semiconductor devices are formed and a fabricating method thereof.

2. Discussion of Related Art

In general, a circuit includes transistors, resistors, capacitors, and/or inductors. It is difficult to fabricate an inductor on the same semiconductor substrate where transistors, resistors, and capacitors are formed because of its substantially planar, coiled shape. Despite such difficulty, techniques of fabricating inductors on a semiconductor substrate along with transistors, resistors, and capacitors are studied by designers who design circuitry and semiconductor chips.

A technique of forming inductors with transistors, resistors, capacitors on the same semiconductor substrate is disclosed by Chan M. Desaigoudar in U.S. Pat. No. 5,370, 766. Inductors of the related art are fabricated by forming an insulating layer on a substrate, and then forming the inductors from electrically-conductive substances such as Al, Au, Ag and the like on the insulating layer.

In this case, the inductors are formed to have coiled shapes by patterning a conductive substance having been deposited on an insulating layer. Then, inductor coil terminal pads, which connect the inductors through vias to neighbouring capacitors, transistors or the like to constitute a circuit, are formed. The inductor coil terminal pads are formed between the substrate and the inductors.

As mentioned in the above description, inductors are fabricated by the processes of forming transistors, resistors, and capacitors on a semiconductor substrate in the related art. Unfortunately, the surface area of the inductors are large because the inductors of the related art are formed on the semiconductor substrate as a two-dimensional coil.

SUMMARY OF THE INVENTION

In contrast to the prior art's substantially planar coil-shaped inductors, the inductor according to the present invention is a three-dimensional spiral structure. In the method according to the present invention, conductive segments forming the bottom portion of each loop in the spiral are formed by ion-implantation into a semiconductor layer. The conductive segments are spaced apart in a first direction. A first dielectric layer crossing the mid portions of these conductive segments is formed to have a strip-like shape extending in the first direction. A conductive core is then formed on the first dielectric layer. A second dielectric layer is formed over the semiconductor layer, and two contact holes for each conductive segment are formed in the second dielectric layer. One contact hole exposes a portion of the conductive segment on one side of the first dielectric layer, and the other contact hole exposes a portion of the conductive segment on the other side of the first dielectric layer. Metal is then deposited over the second dielectric layer so that the contact holes are filled, and the metal is etched to form conductive pattern segments, which form the top and side portions of each loop in the inductor. Specifically, the conductive pattern segment connects one side of one conductive segment to the other side of the next conductive segment.

Accordingly, an inductor formed according to the present invention can be formed on the same semiconductor substrate from which other devices are fabricated, and because of its three-dimensional structure, the inductor takes up significantly less surface area than conventional inductors.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

In the drawings.

DETAILED DESCRIPTION OF THE PREFERRED EMBODIMENTS

Figure 1:
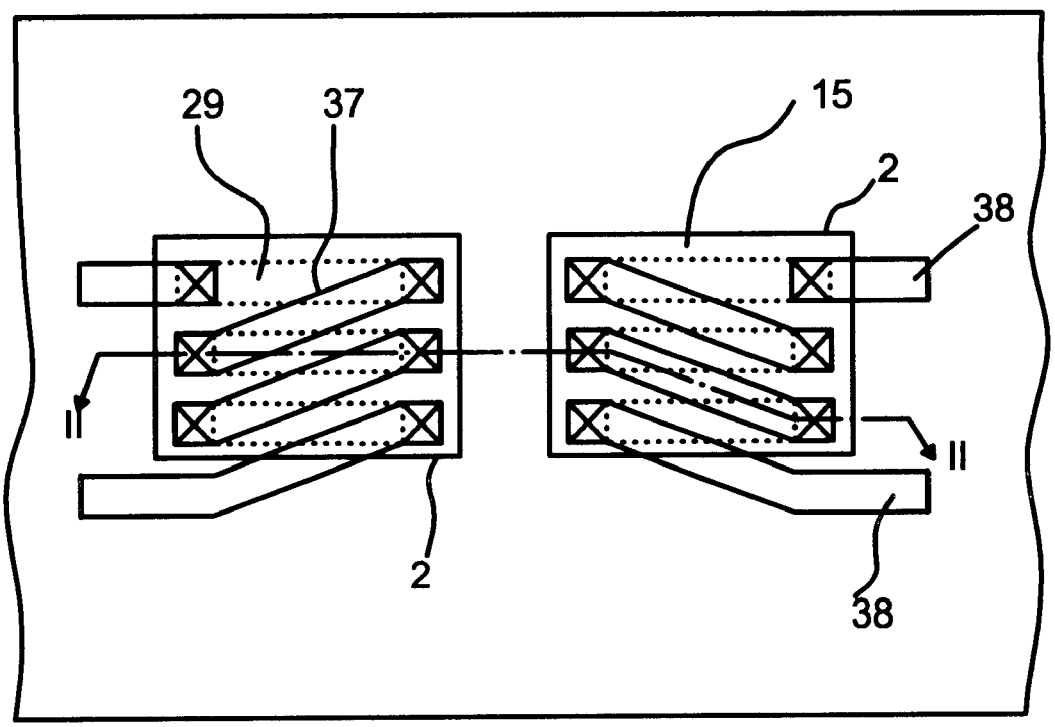
FIG. 1 shows a layout of inductors according to the present invention.

FIG. 1 illustrates the layout of two side-by-side inductors 2 according to an embodiment of the present invention. As shown, each inductor 2 is a three-dimensional coil. Each loop in the spiral forming the inductor 2 includes a conductive segment 29, forming the bottom portion of the loop, and a conductive pattern segment 37 forming the top and side portions of the loop. Conductive lines 38 connect to the ends of each inductor 2. As shown in FIG. 1, a cross-section line II—II cuts along the length of a conductive segment 29 in the inductor on the left-hand side of FIG. 1, and cuts along the length of a conductive pattern segment 37 in the inductor 2 on the right hand-side of FIG. 1.

The method of fabricating inductors according to an embodiment of the present invention will now be explained with-reference to the cross-sectional views illustrated in FIGS. 2A–2E. The cross-section views in FIGS. 2A–2E are taken along the cross-section line II—II.

Figure 2A:
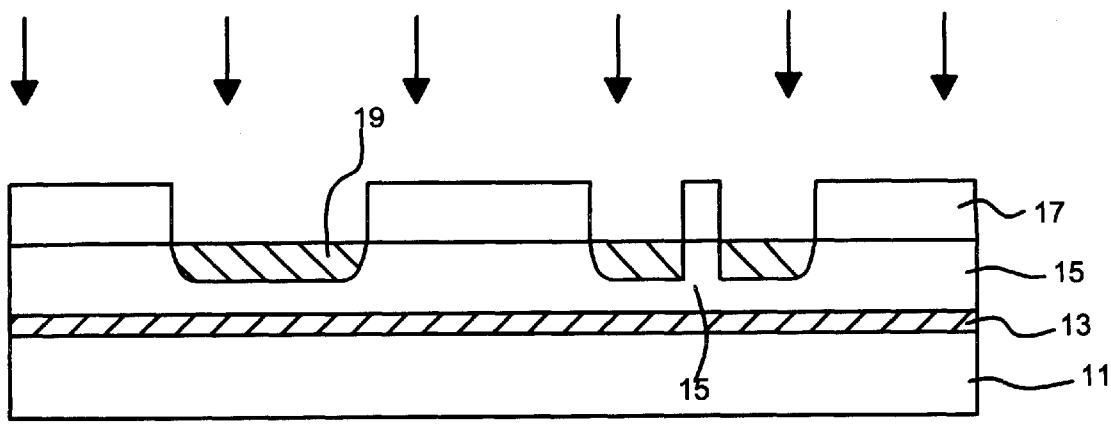
FIG. 2A to FIG. 2E show cross-sectional views of a method of fabricating inductors according to a first embodiment of the present invention along line II—II.

FIG. 2A illustrates a silicon on insulator (SOI) wafer wherein a buried insulating layer 13, buried in a semiconductor substrate 11, results in a semiconductor layer 15 of mono-crystalline silicon on the buried insulating layer 13. The semiconductor layer 15 is coated with photoresist, and the photoresist is patterned. The resulting photoresist pattern 17 exposes portions of the semiconductor layer as shown in FIG. 2A. Next, ions are implanted into the exposed portions of the semiconductor layer 15 to form ion-implanted regions 19. The ion-implanted regions 19 will eventually become the conductive segments 29 of the inductors 2. In a preferred embodiment, the ion implantation is carried out using an n-type impurity such as P, As, etc. at a dose of $1 \times 10^{15}$ to $1 \times 10^{17}$ ions/cm$^2$ and at an energy between 60 to 100 KeV. However, the ion implanted regions 19 can also be formed by implanting p-type impurities such as B, BF2, etc.

Figure 2B:
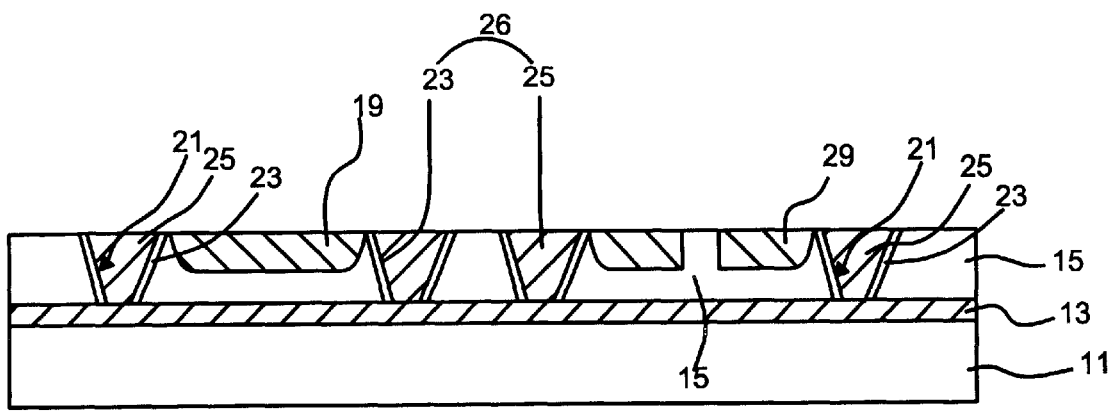

Next, the photoresist pattern 17 is removed, and as shown in FIG. 2B, device separation areas 26 are formed. The device separation areas 26 are formed by shallow trench isolation (STI) in the semiconductor layer, 15. Specifically, trenches 21 are formed on either side of the ion-implanted regions 19 in the semiconductor layer 15. The trenches 21 are formed by photolithography including an anisotropic etch such as RIE, plasma etch, etc., and expose the buried insulating layer, 13. The trenches 21 are narrow, and border/define the active areas of the semiconductor layer 15. An insulating layer 23 is formed on the sides of each trench 21, and then a filler 25 is deposited in each trench 21.

Preferably, the insulating layer 23 is formed 200 to 500 Angstroms thick by thermal oxidation. Then the filler 25 of undoped polysilicon, silicon oxide or silicon nitride is deposited by chemical vapor deposition (CVD), and an etch back is conducted to obtain the structure shown in FIG. 2B.

Figure 2C:
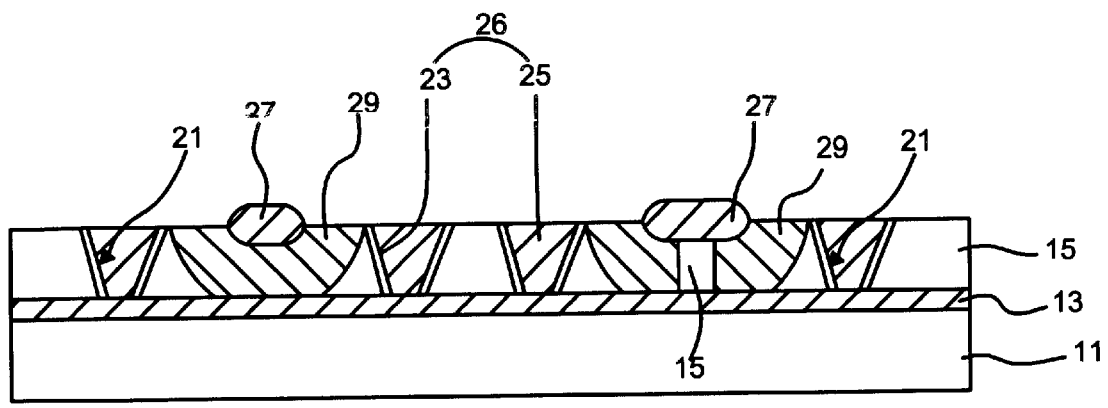

Referring to FIG. 2C, a first dielectric layer 27 is formed over the semiconductor layer 15 by local oxidation of silicon (LOCOS) and subsequent patterning. Preferably, the first dielectric layer 27 of silicon oxide is formed 4000 to 6000 Angstroms thick. During the formation of the first dielectric layer 27, the ions in the ion-implanted, regions become activated and diffuse to create conductive segments 29. It will be understood that the first dielectric layer 27 could also be formed by CVD and subsequent patterning.

As shown in FIG. 2C, the first dielectric layer 27 crosses over the middle portion of each conductive segment 29. Accordingly, with reference to FIG. 1, conductive segments 29 of an inductor 2 are formed spaced apart in a first direction, and as apparent from FIG. 2C, the first dielectric layer 27 is a strip formed along the first, direction crossing the middle portions of the conductive segments 29.

Figure 2D:
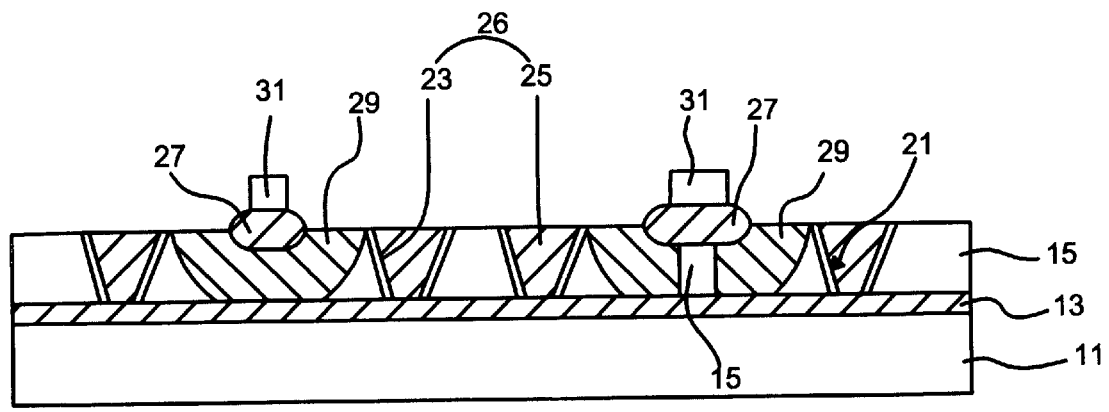

Next, as shown in FIG. 2D, a conductive core 31 is formed on the first dielectric layer 27. Specifically, polycrystalline silicon doped with n-type or p-type impurities is deposited over the substrate 11 using CVD and then patterned. As shown in FIG. 2D, the width of the conductive core 31 is less than the width of the first dielectric layer 27.

Figure 2E:
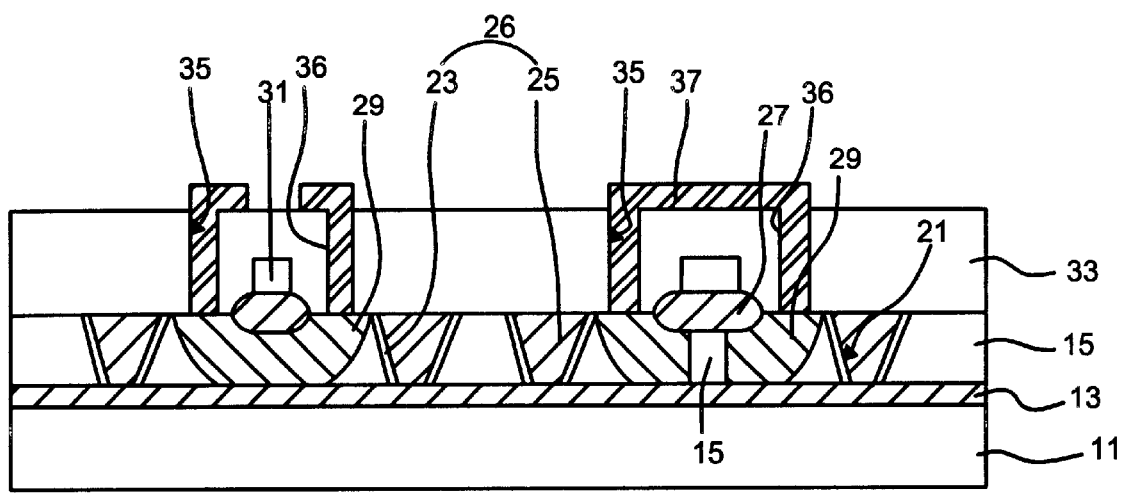

Referring to FIG. 2E, a second dielectric layer 33 is formed over the semiconductor substrate 11. Preferably, the second dielectric layer 33 is formed by depositing an insulator such as silicon oxide, BPSG, etc. using CVD to a thickness of 5000 to 10000 Angstroms, and then planarizing the surface of the insulator.

Subsequently, first and second contact holes 35 and 36 are formed in the second dielectric layer 33. The first contact hole 35 exposes a portion of the conductive segment 29 on the left side of the first dielectric 27 and the second contact hole 36 exposes a portion of the conductive segment 29 on the right side of the first dielectric 27. Then, a metal such as Al, Ti, W, Co, Mo, etc. is deposited by CVD over the semiconductor substrate 11 such that the metal fills the first and second contact holes 35 and 36. The metal is patterned by photolithography to form conductive pattern segments 37 (see also FIG. 1) that electrically connect one conductive segment 29 via a first contact hole 35 to the next conductive segment 29 via a second contact hole 36 in an inductor 2. The patterning of the metal also forms the conductive lines 38 (see FIG. 1). Accordingly, the conductive segments 29 and the conductive pattern segments 37 form a three-dimensional spiral with a conductive core 31, insulated therefrom, running along the longitudinal axis of the spiral.

A method of fabricating an inductor according to a second embodiment of the present invention will now be described with reference to FIGS. 3A–3C. The cross-section views in FIGS. 3A–3C are also taken along the cross-section line II—II in FIG. 1.

Figure 3A:
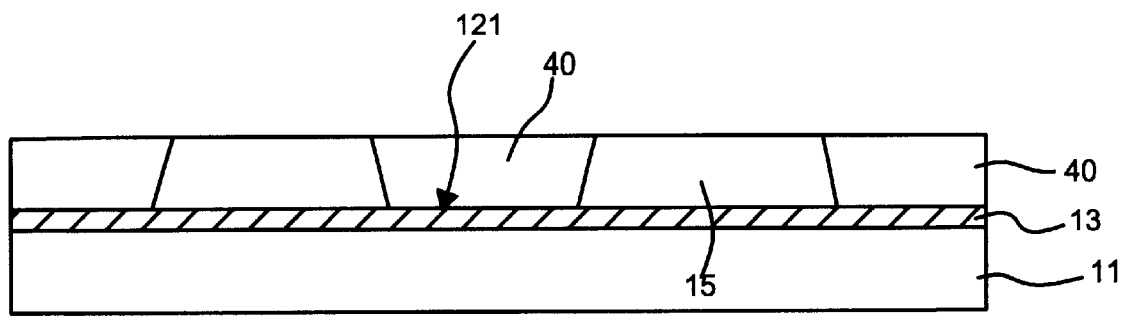
FIG. 3A to FIG. 3C show cross-sectional views of a method of fabricating an inductor according to a second embodiment of the present invention.
Figure 3B:
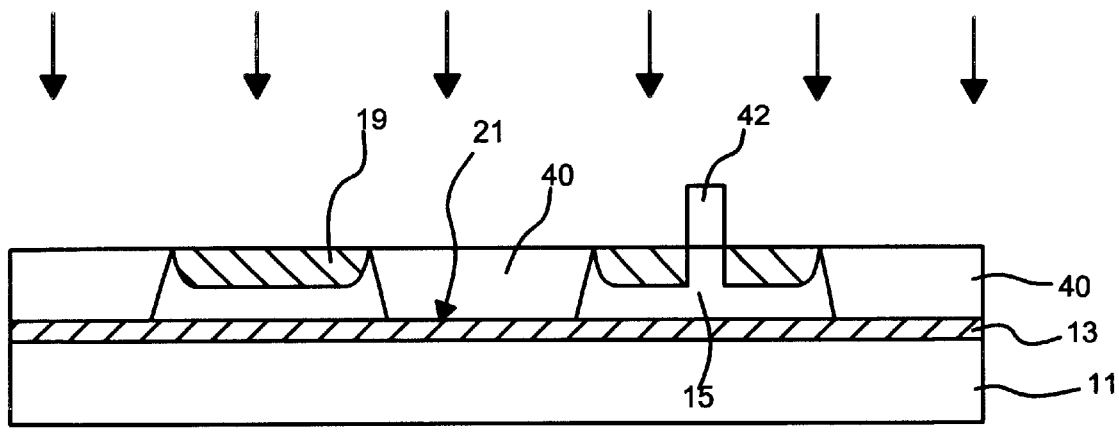

FIG. 3A illustrates a silicon on insulator (SOI) wafer wherein a buried insulating layer 13, buried in a semiconductor substrate 11, results in a semiconductor layer 15 of mono-crystalline silicon on the buried insulating layer 13. Then, trenches 121 are formed in the semiconductor layer 15 to expose the buried insulating layer 13. Preferably, the trenches 121 are formed using photolithography including an anisotropic etch such as RIE, plasma etch, etc. Unlike trenches 21 in the previous embodiment, the trenches 121 are wide, and define the active areas as non-trench regions. Device separating areas 40 are then formed by depositing silicon oxide or silicon nitride using CVD over the semiconductor substrate 11 and conducting an etch back to obtain the structure shown in FIG. 3A.

Next, the semiconductor layer 15 is coated with photoresist, and the photoresist is patterned. The resulting photoresist pattern 42 exposes predetermined portions of the active areas as shown in FIG. 3B. Next, ions are implanted into the exposed portions of the semiconductor layer 15 to form ion-implanted regions 19. The ion-implanted regions 19 will eventually become the conductive segments 29 of the inductors. In a preferred embodiment, the ion implantation is carried out using an n-type impurity such as P, As, etc. at a dose of $1 \times 10^{15}$ to $1 \times 10^{17}$ ions/cm$^2$ and at an energy between 60 to 100 KeV. However, the ion implanted regions 19 can also be formed by implanting p-type impurities such as B, BF2, etc.

Figure 3C:
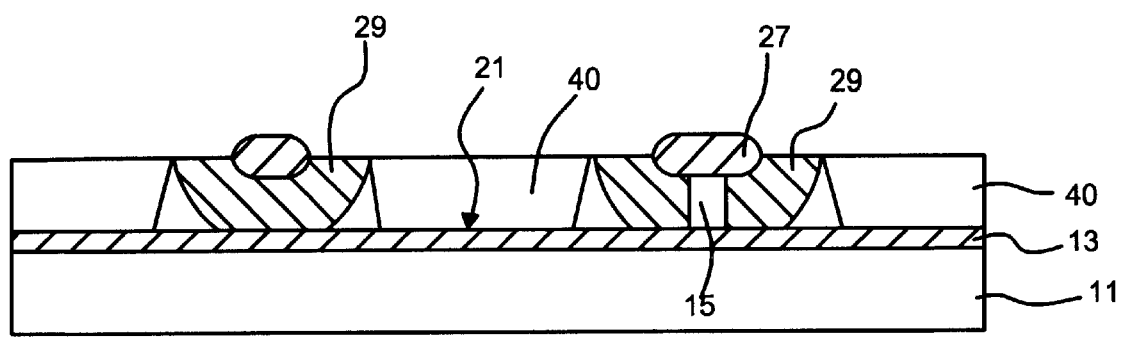

As shown in FIG. 3C, a first dielectric layer 27 and conductive segments 29 are formed. The first dielectric layer 27 and the conductive segments 29 are formed in the same manner as discussed above with respect to the first embodiment. Completing the fabrication of the inductors according to the second embodiment then proceeds as described above with respect to FIGS. 2D–2E.

Accordingly, an inductor formed according to the present invention can be formed on the same semiconductor substrate from which other devices are fabricated, and because of its three-dimensional structure, takes up significantly less surface area than prior inductors.

It will be apparent to those skilled in the art that various modifications and variations can be made in the inductor and fabricating method thereof according to the present invention without departing from the spirit or scope of the invention. Thus, it is intended that the present invention cover the modifications and variations of this invention provided they come within the scope of the appended claims and equivalents.

I claim:

1. A method of fabricating an inductor, comprising:

forming first and second conductive segments in a semiconductor layer, the first and second conductive segments spaced apart in a first direction;

forming a first dielectric layer over a portion of the semiconductor layer along the first direction such that the first dielectric layer crosses the first and second conductive segments;

forming a conductive core over the first dielectric layer;

forming a second dielectric layer over the semiconductor layer;

forming at least first and second contact holes in the second dielectric layer, the first contact hole exposing a portion of the first conductive segment on a first side of the first dielectric layer and the second contact hole exposing a portion of the second conductive segment on a second side of the first dielectric layer, the second side being opposite the first side; and forming a conductive pattern segment over the second dielectric layer that electrically connects the first and second conductive segments via the first and second contact holes.

2. The method of claim 1, further comprising:

forming the semiconductor layer by forming a buried insulating layer in a semiconductor substrate such that the semiconductor layer is on the buried insulating layer.

3. The method of claim 1, wherein the semiconductor layer is mono-crystalline silicon.

4. The method of claim 1, wherein the forming first and second conductive segments step comprises:

implanting impurities into first and second portions of the semiconductor layer.

5. The method of claim 4, wherein the impurities are n-type impurities.

6. The method of claim 4, wherein the impurities are p-type impurities.

7. The method of claim 1, wherein the forming a first dielectric layer comprises:

performing LOCOS (local oxidation of silicon).

8. The method of claim 1, wherein the forming a first dielectric layer comprises:

depositing silicon oxide by chemical vapor deposition.

9. The method of claim 1, wherein the forming a first dielectric layer step forms the first dielectric layer to have a first width; and the forming a conductive core step forms the core with a second width, which is less than the first width.

10. The method of claim 1, wherein the conductive core includes polysilicon doped-with impurities selected from the group consisting of p-type impurities and n-type impurities.

11. The method of claim 1, wherein the second dielectric layer is selected from the group consisting of silicon oxide and boro-phospho silicate glass.

12. The method of claim 1, wherein the conductive pattern segment is selected from the group consisting of Al, Ti, W, Co, and Mo.

13. The method of claim 1, further comprising:

forming a device separation area to define at least one active area; and wherein the forming at least first and second conductive segments step forms the first and second conductive segments in the active area.

14. The method of claim 1, wherein the forming a device separation area comprises:

forming at least one trench in the semiconductor layer;

forming insulating material on sides of the trench; and forming filler material in the trench.

15. The method of claim 14, wherein the filler material is selected from the group consisting of undoped polycrystalline silicon, silicon oxide, and silicon nitride.

\* \* \* \* \*